United States Patent [19]

Matsumoto

[11] Patent Number: 5,113,211

[45] Date of Patent: May 12, 1992

[54] IMAGE FORMING APPARATUS USING PHOTOPOLYMERIZATION REACTION

[75] Inventor: Kenichi Matsumoto, Tokyo, Japan

[73] Assignee: Canon Kabushiki Kaisha, Tokyo, Japan

[21] Appl. No.: 680,372

[22] Filed: Apr. 4, 1991

[30] Foreign Application Priority Data

Apr. 6, 1990 [JP] Japan .................................. 2-90162

[51] Int. Cl.⁵ ........................ G03B 27/32; G03B 27/52
[52] U.S. Cl. ..................................... 355/27; 355/100; 355/104; 355/106
[58] Field of Search .................. 355/27, 100, 106, 104

[56] References Cited

U.S. PATENT DOCUMENTS

4,698,284 10/1987 Cronin ................................... 355/27
4,794,061 12/1988 Cronin ................................... 355/100

Primary Examiner—Monroe H. Hayes
Attorney, Agent, or Firm—Fitzpatrick, Cella, Harper & Scinto

[57] ABSTRACT

The present invention aims to make an image forming apparatus using photopolymerization reaction small-sized, and the image forming apparatus is designed so that a supporting device for supporting a photosensitive image forming member used in a sheet fashion and having a polymerizable layer is shifted endlessly. Further, an exposure device for effecting the image exposure on the image forming member is disposed within a light-shield mechanism, and a whole image exposure device is also disposed within this lightshield mechanism. The image formation on the image forming member is effected by shifting the supporting device endlessly, by passing the image forming member through the exposure device at least two times, by effecting the image exposure by the exposure device, by effecting the heating by a heating device and by effecting whole image exposure at a position of the exposure device.

8 Claims, 5 Drawing Sheets

IMAGE FORMING APPARATUS USING PHOTOPOLYMERIZATION REACTION

BACKGROUND OF THE INVENTION

1. Field of the Invention

The present invention relates to an image forming apparatus for forming a polymer image including the polymer disposed in an image pattern, on a photosensitive image forming member (referred to merely as "image forming member" hereinafter).

2. Related Background Art

An image portion and a non-image portion of a polymer image have different properties of matter such as wetness and/or adhesion in accordance with the difference in the degree of polymerization and/or of bridge formation, and, therefore, the polymer image has widely been utilized as a means for forming a color image. While various methods for forming such polymer images are already known, generally, the silver salt or a metal mask is used to obtain a printed board, photoresist and the like and the photopolymerization is effected by means of a light source such as a mercury lamp having strong light intensity to form the polymer image.

However, since such method requires complex processes such as a liquid treatment process because of the presence of the silver salt or the metal mask, there arise drawbacks that it requires much labor and time and that the whole system becomes bulky.

Various improvements have been tried to simplify such method and to perform such method with the complete dry treatment processes. For example, as disclosed in the Japanese Patent Laid-Open Nos. 61-75342, 55-50246 and 62-17155 (corresponding to U.S. Ser. No. 302,270 filed on Jan. 27, 1989 in U.S.A), there has been provided a method wherein, after the photosensitive material made of at least photosensitive silver halide, organic silver salt, reducing agent and the like is exposed (image exposure process), the reaction is caused (heating process) by applying heat at a heat developing portion, thereby affording the polymerization prohibiting ability and light-shielding ability to the produced, quenched or decomposed substances, and thereafter, the polymerizing and bridging reaction is caused by light at a whole image exposure portion (whole image exposure process) to form the polymer image.

The method for forming the polymer image by utilizing the photopolymerization reaction as mentioned above takes an advantage that each reaction in each process can be easily controlled, thus providing an image with high resolving power and high contrast, because in such method, a plurality of chemical reactions are not concurrently progressed (unlike the heat polymerization reaction), but each chemical reaction is effected in each process.

However, in such an image forming apparatus using the dry treatment process, the whole image exposure treatment is inevitably required for effecting the polymerizing and bridging reaction by the light with respect to the image forming member passed through the heat developing portion.

As a light source used with the whole image exposure treatment, a mercury lamp or a fluorescent lamp for emitting ultraviolet radiation is used for forming the polymer image by the ultraviolet radiation. When the fluorescent lamp is used, it is necessary to reserve an adequate axial room for avoiding the arrangement of the filament at both ends of the lamp and a surrounding space for arranging a reflection plate and the like. On the other hand, when the mercury lamp is used, a lens for condensing the light from the lamp and a cooling system for the lamp are inevitably required, thus making the whole light source bulky. Thus, the whole image exposure portion requires a relatively large installation space, leading to a problem that the whole image forming apparatus becomes large-sized Further, in order to prevent the occurrence of the fog area on the image forming member, the light from the whole image exposure portion must not be illuminated on the image forming member until the heat development regarding the image forming member has been completed. Accordingly, in order to prevent the leak of light from the whole image exposure portion to the heat developing portion, different light-shield means must be provided both at the image exposure portion and at the whole image exposure portion. Particularly, in an area where the image forming member is fed through such light-shield means, the construction of the light-shield means of the whole image exposure portion becomes complex, thus arising a problem that the reliability of the light-shield means is worsened.

Among the above-mentioned image forming apparatuses, the apparatus using the liquid treatment process arises problems that it takes a long time for forming the image and that the whole apparatus becomes bulky.

On the other hand, in the apparatus using the dry treatment process, since the installation space for the whole image exposure portion is increased, there arise problems that the whole apparatus becomes bulky and that the light-shield means for preventing the leak of light from the whole image exposure portion to the heat developing portion becomes complex and the reliability of the light-shield means is worsened.

SUMMARY OF THE INVENTION

An object of the present invention is to eliminate the above-mentioned drawbacks and problems regarding the conventional image forming apparatuses using the photopolymerization reaction.

Another object of the present invention is to make an image forming apparatus using the polymerization reaction small-sized or compact.

The other object of the present invention is to provide an image forming apparatus in which a plurality of images can be formed on a single photosensitive image forming member.

In order to achieve the above objects, the present invention provides an image forming apparatus using photopolymerization reaction, comprising: a photosensitive image forming member having a layer of polymer compound and adapted to be used in a sheet-like fashion during the formation of an image; an image forming member supporting element for supporting the photosensitive image forming member and adapted to be moved endlessly; an image forming member supplying means for supplying the photosensitive image forming member to the supporting element; an exposure means disposed in confronting relation to the image forming member supporting element and adapted to effect image exposure on the image forming member; a light-shield means for shielding light leaking from the exposure means; a heating means disposed in confronting relation to the image forming member supporting element at a downstream side of the exposure means with respect to a rotating direction of the supporting element; and a whole image exposure means arranged in the light-shield means.

DETAILED DESCRIPTION OF THE PREFERRED EMBODIMENTS

The present invention will now be explained in connection with embodiments thereof with reference to the accompanying drawings.

Figure 1:
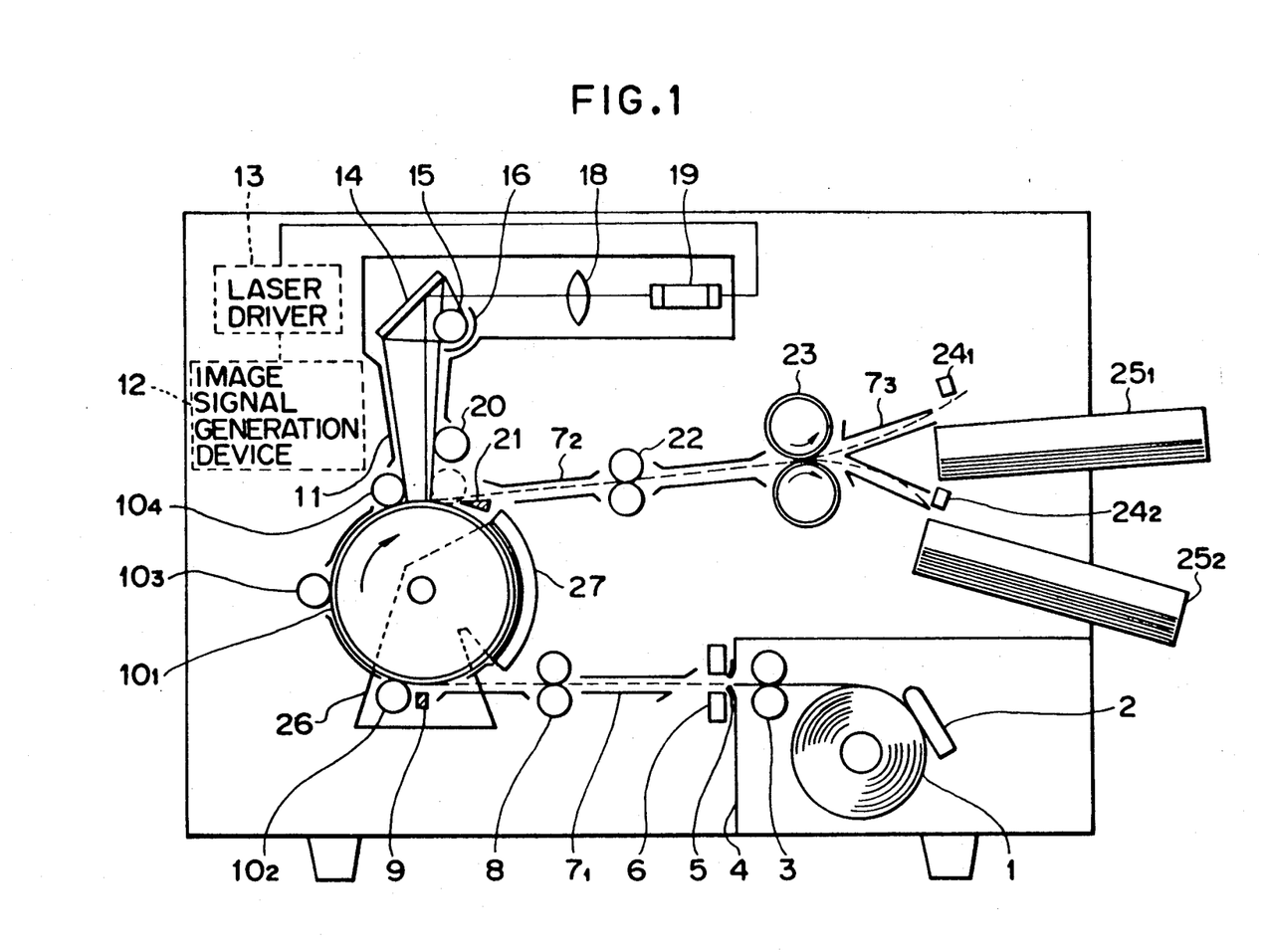
FIG. 1 is a schematic elevational sectional view of an image forming apparatus according to a first embodiment of the present invention.

FIG. 1 is a schematic elevational sectional view of an image forming apparatus according to a first embodiment of the present invention.

An image forming apparatus according to this first embodiment serves to form an image by using an image forming member 1 having a plurality of layers as shown in the Japanese Patent Laid-Open No. 1-196041 (corresponding to U.S. Ser. No. 558,639 filed on July 27, 1990 in U.S.A) and includes an image exposure portion, a heat developing portion, a whole image exposure portion, a separating or peeling portion, and an ejecting portion, these portions being interconnected by feeding guides $7_1$ to $7_3$ as shown.

Next, the details of these portions will be described in accordance with a sequence for forming the image.

Figure 4A:
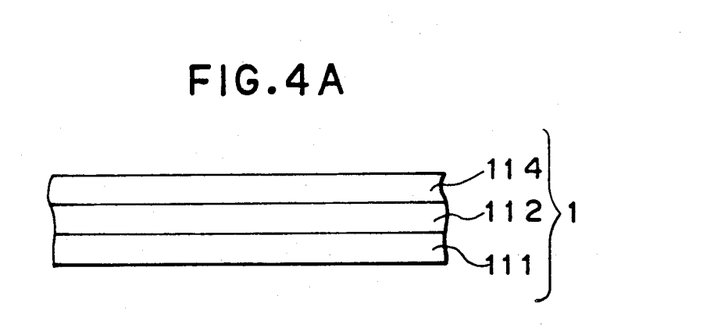
FIGS. 4A to 4C are explanatory views for explaining the construction of a photosensitive image forming member used in the above embodiments.
Figure 4B:
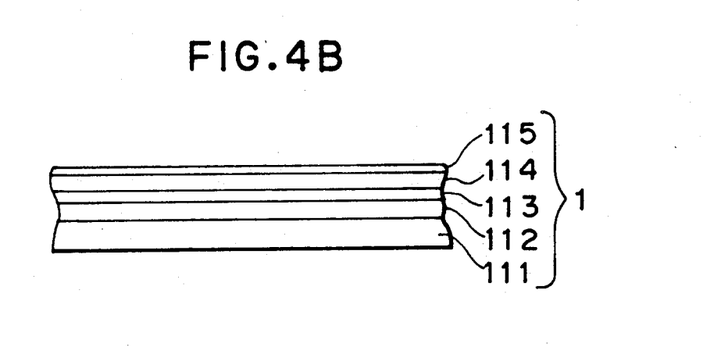
Figure 4C:
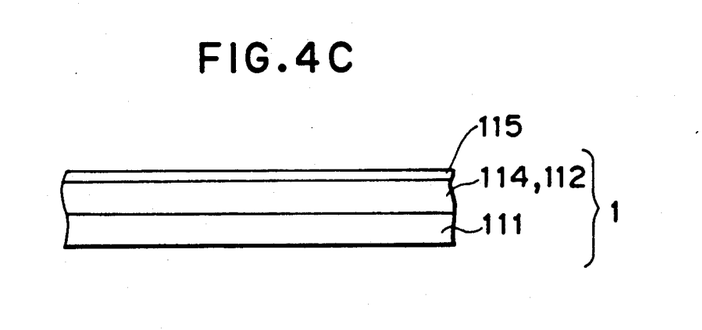

FIGS. 4A to 4C show the construction of the image forming member 1.

The image forming member 1 to be used in the present invention may be of a multi-layer constitution having a photosensitive layer 114 containing a heat developing type photosensitive composition and a polymerization layer 112 containing a photopolymerizable composition in combination, or of a single layer constitution containing a heat developing type photosensitive composition and a photopolymerizable composition in the same layer as in FIG. 4C. Numeral 115 is a protective layer, 113 is an intermediate layer, or otherwise a subbing layer may be also provided. For the intermediate layer 113, the protective layer 115, various plastic films such as polyethylene terephthalate, polypropylene, polyethylene, Cellophane, polyimide, 6,6-nylon, polystyrene, etc. or resins such as polyvinyl alcohol, polyvinyl butyral, etc. can be employed. Further, composite materials comprising two or more kinds of these materials can be also employed.

As the above-mentioned heat developing type photosensitive composition, at least a photosensitive silver halide, an organic silver salt and a specific reducing agent are contained, and as the photopolymerizable composition, at least a polymerizable polymer precursor and a photopolymerization initiator are contained.

As the silver halide contained in the heat developing type photosensitive composition, known silver halides in photographic technology, etc. can be used. For example, any of silver halide, silver bromide, silver iodide, silver chlorobromide, silver chloroiodide, silver iodobromide, silver chloroiodide can be employed.

The halogenic composition of the silver halide grains may be either uniform or nonuniform on the surface and internally thereof. In the present invention, the grain size of the silver halide grain may be preferably from 0.001 μm to 10 μm, particularly from 0.001 μm to 5 μm.

These may be also applied with chemical sensitization, optical sensitization as practiced for photographic emulsions in general. A chemical sensitization, sulfur sensitization, noble metal sensitization, reduction sensitization, etc. can be employed, and for optical sensitization, the method by use of an optical sensitizing dye such as cyanine dye, melocyanine dye, etc. is applicable.

As the organic silver salt, there may be included silver salts of aliphatic carboxylic acids, aromatic carboxylic acids, thiocarbonyl group compound having mercapto group of α-hydrogen, and imino group containing compounds.

The shape of the image forming member of the present invention is not particularly limited, but may be, for example, a flat plate, a cylinder, a roll, etc.

The image forming member of the present invention should be preferably used by film formation into a thickness of 0.1 μm to 2 mm, preferably 1 μm to 0.1 mm.

A sheet supply portion serves to supply the image forming member 1 to the image exposure portion and the like and is covered by a case 4. The image forming portion 1 is received within the case 4 in such a manner that it is rolled with its base member or layer 111 (FIG. 4) turned upside, and is pinched by a pair of supply rollers 3 to be fed out of the case 4, as shown by the broken line in FIG. 1. A hold-down member 2 is pressed against an outer peripheral surface of the roll of the image forming member 1, thereby preventing the excessive feeding of the image forming member 1 from the sheet supply portion by a friction force between the hold-down member and the roll of the image forming member.

A light-shield member 5 disposed at an outlet for the image forming member 1 outwardly of the case 4 serves to prevent the light from entering into the case 4 through the outlet. The light-shield member 5 has a black velvet as used in a conventional film casing for a silver salt film. Further, before the cassette is used or re-used, a leading end of the image forming member 1 is held within the case 4 as shown, for example by rotating the roll of the image forming member 1 in a reverse direction.

Next, a method for supplying the image forming member 1 from the case 4 will be described with reference to the drawings.

First of all, within the case 4, the leading end portion of the image forming member 1 is pinched b the pair of supply rollers 3. This condition is a waiting condition.

Since a mechanism that the leading end of the image forming member 1 is pinched by the supply rollers 3 when the roll of the image forming member 1 is installed in the case is well-known, such mechanism can easily be realized and the explanation thereof will be omitted.

When a copy button is pressed down, the pair of supply rollers 3 are rotated to feed the image forming member 1 out of the case 4. The outgoing image forming member 1 is then pinched by another pair of supply rollers 8. After the image forming member is fed for a predetermined length (for example, corresponding to a width of A4 size), it is cut by a cutter 6 arranged at a downstream side of the light-shield member 5. Then, the image forming member is fed to the image exposure portion along the guide $7_1$.

Incidentally, it should be noted that, in the image forming apparatus according to this embodiment, the image forming member 1 fed from the sheet supply portion is prevented from being exposed to the surrounding light until the image forming member is passed through the heat developing portion.

Next, the image exposure portion will be described.

The image forming member 1 fed along the guide $7_1$ is then conveyed along a drum-shaped convey roller $10_1$ by means of this convey roller $10_1$, three auxiliary convey rollers $10_2$–$10_4$ arranged around the drum roller $10_1$ and a feed roller 20. The leading end of the image forming member 1 is detected by a sensor 9 disposed between the paired supply rollers 8 and the convey roller $10_2$, and the rotation of the rollers $10_2$–$10_4$ and the feed roller 20 is controlled by a signal from the sensor 9. The feed roller 20 is so designed that it can be shifted in an up-and-down direction, and is brought to a position where it is abutted against the drum roller as shown by the broken line in FIG. 1 during the image exposure operation.

A semi-conductor laser 19 and a polygonal mirror 14 for effecting the image exposure are disposed above the drum roller $10_1$ so that the image forming member 1 is exposed on the drum roller $10_1$ where the image can be focused on the image forming member with high accuracy. The timing for feeding the image forming member 1 is determined by the feeding timing between the drum roller $10_1$ and the auxiliary convey roller $10_2$. The other two auxiliary convey rollers $10_3$ and $10_4$ are rotated at the same speed as that of the convey roller $10_2$; whereas, the feed roller 20 is rotated at a speed faster than those of the convey rollers to prevent the image forming member from being slacked.

The image exposure portion further includes a laser driver 13 for driving the semi-conductor laser 19 and an image signal generation device 12 for generating a signal for driving a conventional polygonal mirror and the polygonal mirror 14 which serve to perform the scanning operation by changing the reflection angle of the light. Since these elements 13 and 12 and associated circuits are already known, the explanation thereof will be omitted. Incidentally, between the rollers $10_4$, 20 and the polygonal mirror 14, there is disposed a light-shield cover 11 for covering the image exposure portion and the whole image exposure portion.

As mentioned above, while the semi-conductor laser scanner exposure means was used in the image exposure portion according to the illustrated embodiment, other exposure means capable of writing the image on the image forming member in response to the image signal may be used. For example, the combination of a shutter array such as CRT, FOT (fiber optical tube), LED, LED array, LCD, PLZT or the like, and a linear or planar light source such as a fluorescent lamp or the like may be used.

Of course, a reflected light image from an original may be directly written on the image forming member 1.

Next, the heat developing portion will be described.

The image exposed on the image forming member 1 at the image exposure portion is then developed at the heat developing portion by heating the image forming member up to about 120° C. A heat generation body 27 is supported by a roller support 26 in such a manner that it surrounds or covers a portion of the drum roller $10_1$. The energization of the heat generation body 27 is initiated immediately before the image forming member 1 reaches a lower portion of the roller support 26 to heat the heat generation body 27 up to 120° C., and the heat generation after the image forming member 1 has been passed through the power portion of the roller support 26. Sensors (not shown) are provided on the heat generation body 27 and the roller support 26, respectively, to detect the temperature thereof.

Next, the whole image exposure portion will be described.

After the heat developing operation is finished, the image forming member 1 is fed to the image exposure position again by the rollers $10_1$–$10_4$. The whole image exposure portion is constituted by a light source 15, a reflection plate 16, and the polygonal mirror 14 used in the image exposure portion. Light emitted from the light source 15 is sent to the polygonal mirror directly or via the reflection plate 16, and is reflected by the polygonal mirror to reach and expose the image forming member 1. In the illustrated embodiment, the light source comprises a fluorescent lamp of 15 Watt having a peak wave length of 380 nm. The fluorescent lamp of 15 Watt comprises a tube of aperture type wherein an angle of an aperture portion for exposing the image forming member 1 via the reflection plate 16 and the polygonal mirror is 70 degrees. Further, a distance between a tubular surface of the fluorescent lamp and the image forming member 1 is selected to have a value of about 100 mm. Of course, as shown in FIG. 1, the position of the light source (fluorescent lamp) 15 is selected not to be interfered with a light path of the laser beam emitted from the semi-conductor laser 19. And, the light source 15 is deenergized during the image exposure operation.

Further, upon the whole image exposure operation, since the waste heat is remained in the image forming member 1 due to the heating during the heat developing operation, a surface temperature of the image forming member will be 100° C. or thereabout.

Since a driving means (for example, inverter driver) for activating the light source is well-known, the explanation thereof will be omitted.

After the whole image exposure operation is finished, the image forming member 1 is then fed to the peeling portion. In this case, in order to facilitate the conveyance of the image forming member, the feed roller 20 is lifted up to a position shown by the solid line in FIG. 1. After the image forming member 1 has passed through below the feed roller 20, it is separated from drum roller $10_1$ by means of a separation claw or pawl 21 which can be shifted in a horizontal direction and be approaching to the leading end of the image forming member at a proper timing. Then, the image forming member is fed to the separating portion by means of a pair of conveying rollers 22.

Incidentally, the light-shield cover 11 disposed between the rollers $10_4$, 20 and the polygonal mirror 14 serves not only to prevent the light of the whole image exposure from illuminating the image forming member 1 before the heat developing operation but also to keep a slit width constant to effect the whole image exposure with the given light amount.

With the arrangement as mentioned above, it is possible to prevent the occurrence of the fog and patches on the image forming member 1. The heat generation body 27 comprises a linear heater embedded in silicone rubber material, and a surface temperature of the heat generation body is kept constant by feedbacking an output of the sensor (not shown) provided on the heat generation body to a temperature control portion (not shown).

Further, a fiber layer (for example, NOMEX R nonwoven fabric manufactured by Du Pont) having thermal resistance is adhered onto the surface of the drum roller $10_1$ to improve the conveying force so that the image forming member 1 entered between the drum roller $10_1$ and the roller support 26 can be fed at a constant speed.

Next, the separating portion will be described.

The image forming member 1 fed from the whole image exposure portion is separated or divided, by a pair of separation rollers 23, into a portion having a polymerized image and a portion having a non-polymerized image.

The surfaces of the paired separation rollers 23 are constructed to have the increased adhesion property to permit the separation of the image forming member 1 into the above-mentioned two portions. In the illustrated embodiment, the adhesion property is obtained by coating RTV silicone rubber having the rubber hardness of 50 degrees and a thickness of about 2 mm on a surface of each separating roller made of stainless steel, so that the image forming member can be separated into the two portions by the use of the adhesion property of the RTV silicone rubber.

Two portions separated from the image forming member 1 are ejected into ejector trays $25_1$, $25_2$, respectively, through the guide $7_3$.

Sensors $24_1$ and $24_2$ capable of detecting the reflected infrared ray are disposed in the proximity of the ejector trays $25_1$ and $25_2$, respectively, so that the portions separated from the image forming member 1 can be detected.

The image forming apparatus according to the illustrated embodiment further includes an operation portion (not shown) for driving the apparatus and a display portion (not shown) for displaying an operating condition of the apparatus, as well a the above-mentioned various portions. Further, the operation of the various portions can be controlled by a control device (not shown).

Figures 2, 2A:
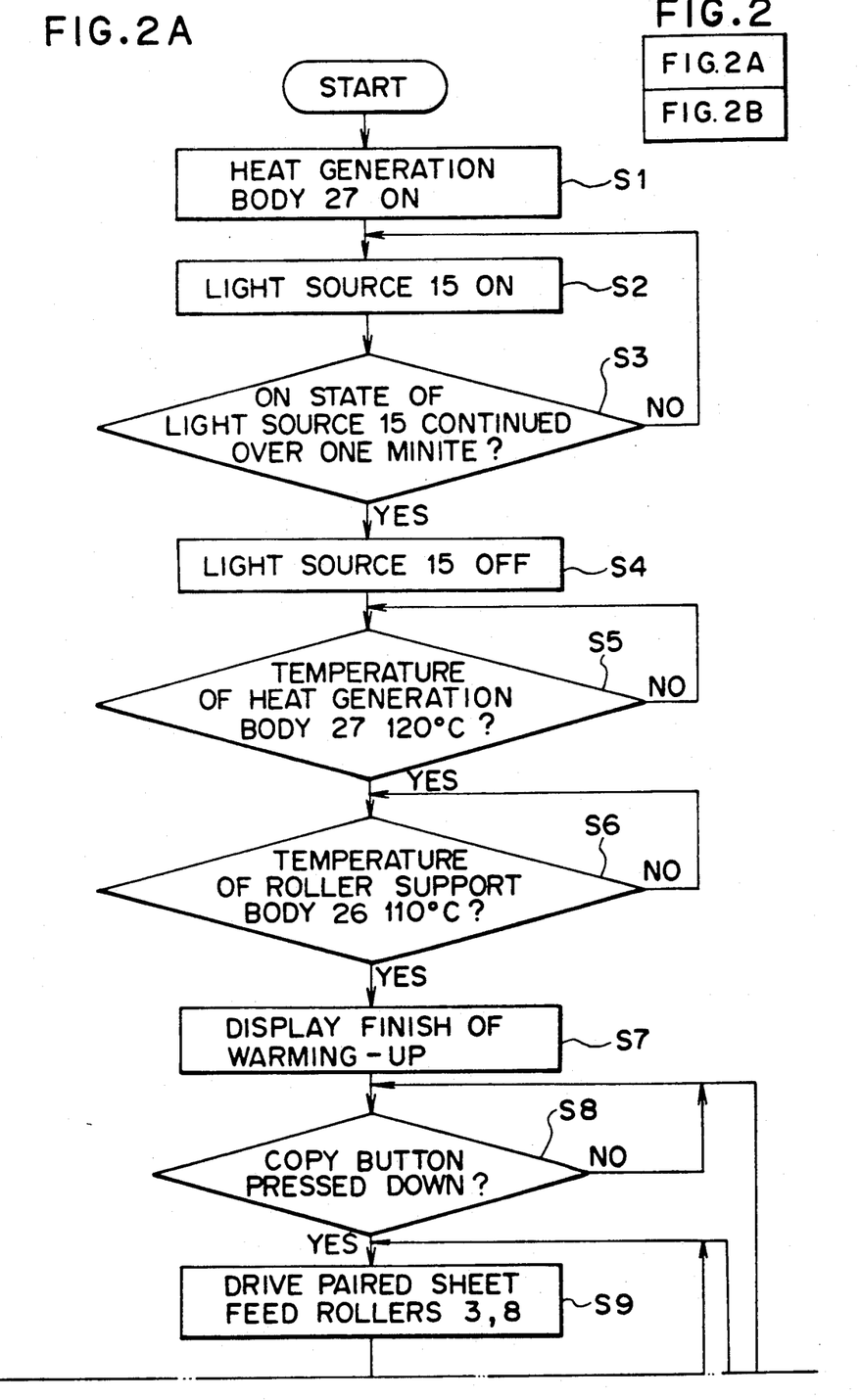
FIGS. 2-2B are a flow chart showing a control sequence for the apparatus of FIG. 1.
Figure 2B:
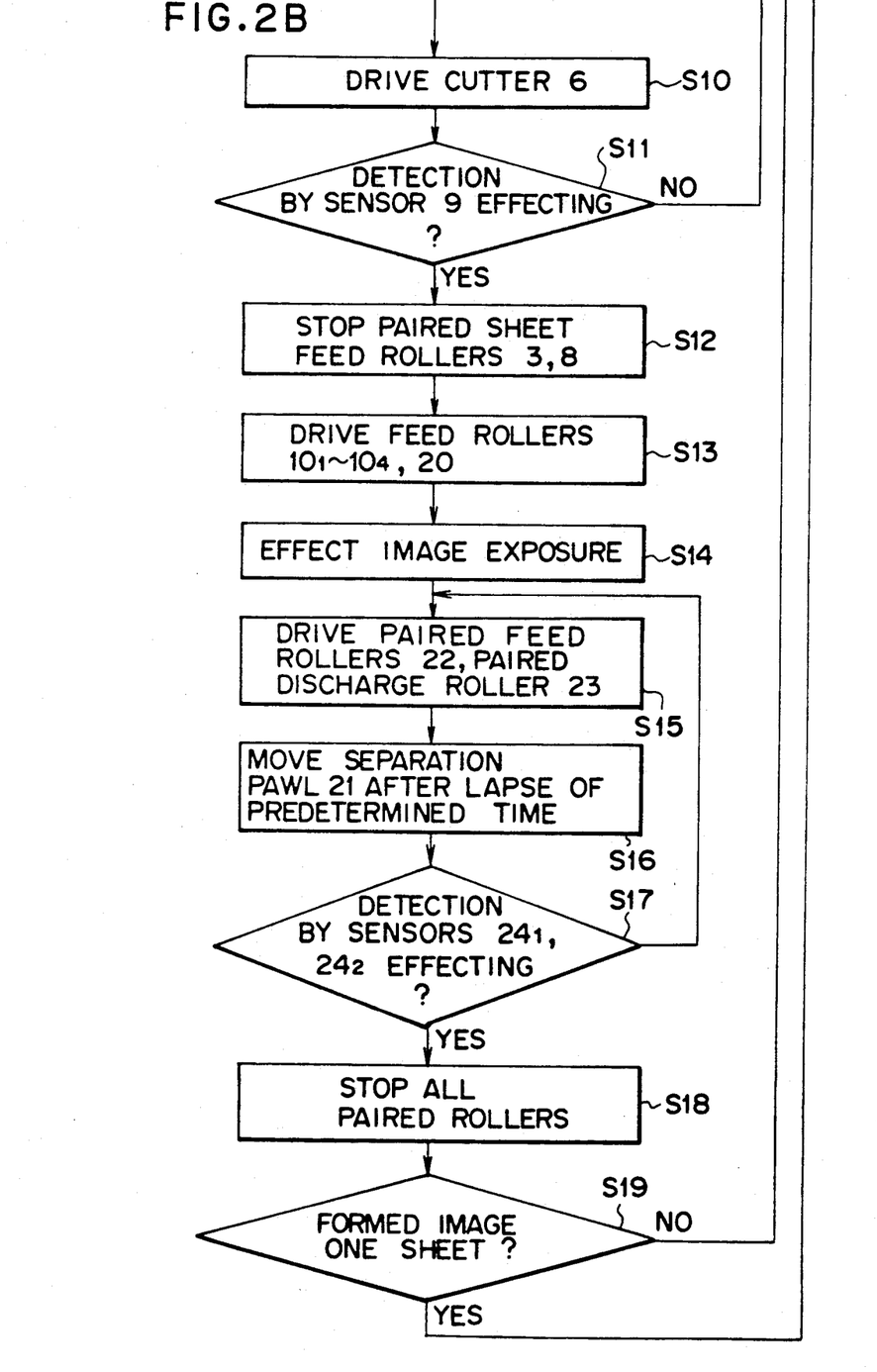

FIG. 2 shows a flow chart showing the control sequence of the aforementioned control device. Now, the operation of the image forming apparatus according to the illustrated embodiment will be explained with reference to FIG. 2.

When a main switch of the operation portion is turned ON, the control device turns ON (energizes) the heat generation body 27 of the heat developing portion and the light source 15 of the whole image exposure portion (steps S1 and S2). Then, it is judged whether the "ON" state of the light source 15 continues over a predetermined time period (one minute) (step S3); if affirmative, the light source 15 is turned OFF (step S4). Next, it is judged whether the temperature of the heat generation body 27 is 120° C. and the temperature of the roller support 26 is 110° C. (Steps S5 and S6). If both affirmative, since the preheated temperature of the drum roller $10_1$ becomes about 80° C., the display portion displays a warming-up finishing condition (step S7).

Next, it is judged whether the copy button of the operation portion is pressed down (step S8); if affirmative, the paired sheet supply (feed) rollers 3, 8 are driven until the image forming member 1 is fed out of the case 4 by a predetermined length (step S9), and, thereafter, the cutter 6 is driven to cut the image forming member (step S10). Then, it is judged whether the cut image forming member 1 is fed to the convey rollers $10_1$, $10_2$ by monitoring the detection condition of the sensor 9 (step S11); if affirmative, the paired sheet supply rollers 3, 8 are stopped (step S12).

Then, after a waiting time when the leading end of the image forming member 1 reaches the nip between the convey rollers $10_1$ and $10_2$ without fail has been elapsed, the rollers $10_1$–$10_4$ and 20 are driven (step S13) to convey the image forming member 1, and at the same time, the image is written by the laser light emitted from the semi-conductor laser 19 driven by the laser driver 13 in response to the image signal from image signal generation device 12 (i.e., the image exposure is effected) (step S14). After the image exposure has been effected, the paired rollers 22, 23 in the separating portion are also driven, as well as the convey rollers $10_1$–$10_4$, 20 (step S15).

After the image exposure operation is finished, the image forming member 1 is sent to the heat developing portion, where the heat generation body 27 is turned ON to increase the surface temperature of the roller support 26 up to 120° C. immediately before the image forming member 1 is sent t this heat developing portion. After the image forming member has been passed through the heat developing portion, it is sent to the image exposure position again, and the whole image exposure is effected by turning the light source 15 ON. Then, the image forming member 1 is separated from the drum roller $10_1$ by moving the separation pawl 21 toward the leading end of the image forming member at the proper timing (step S16), and thereafter, the image forming member is passed through the convey rollers 22 and the separating rollers 23, thus separating it into the aforementioned two portions, these portions then being ejected into the corresponding trays $25_1$, $25_2$, respectively. In this case, the base material of the image forming member 1 is ejected into the tray $25_2$. And, it is judged whether the portions are ejected into the ejector trays $25_1$, $25_2$ by means of the sensors $24_1$, $24_2$ (step S17); if affirmative, all of the rollers convey rollers $10_1$–$10_4$, feed roller 20, paired conveying rollers 22 and paired separation rollers 23) are stopped (step S19). After the image forming member has been passed, the heat developing portion is cooled so that the surface temperature of the roller support is reduced to 80° C. This temperature is maintained until the next image forming member is supplied.

Then, it is judged whether the image to be formed is one sheet (step S19); if the next copy is desired, the above-mentioned sequence is repeated, whereas, if the next copy is not desired now, the heater control of the heat generation body 27 is maintained to 80° C., thus establishing the warming-up condition until the copy button is pressed down again.

As mentioned above, in this embodiment, since the image exposure portion and the light source portion are installed within the same light-shield cover 11 so that the image exposure and the whole image exposure can be effected at the same location, it is possible to make the whole apparatus small-sized and improve the reliability of the light-shield effect.

Figure 3:
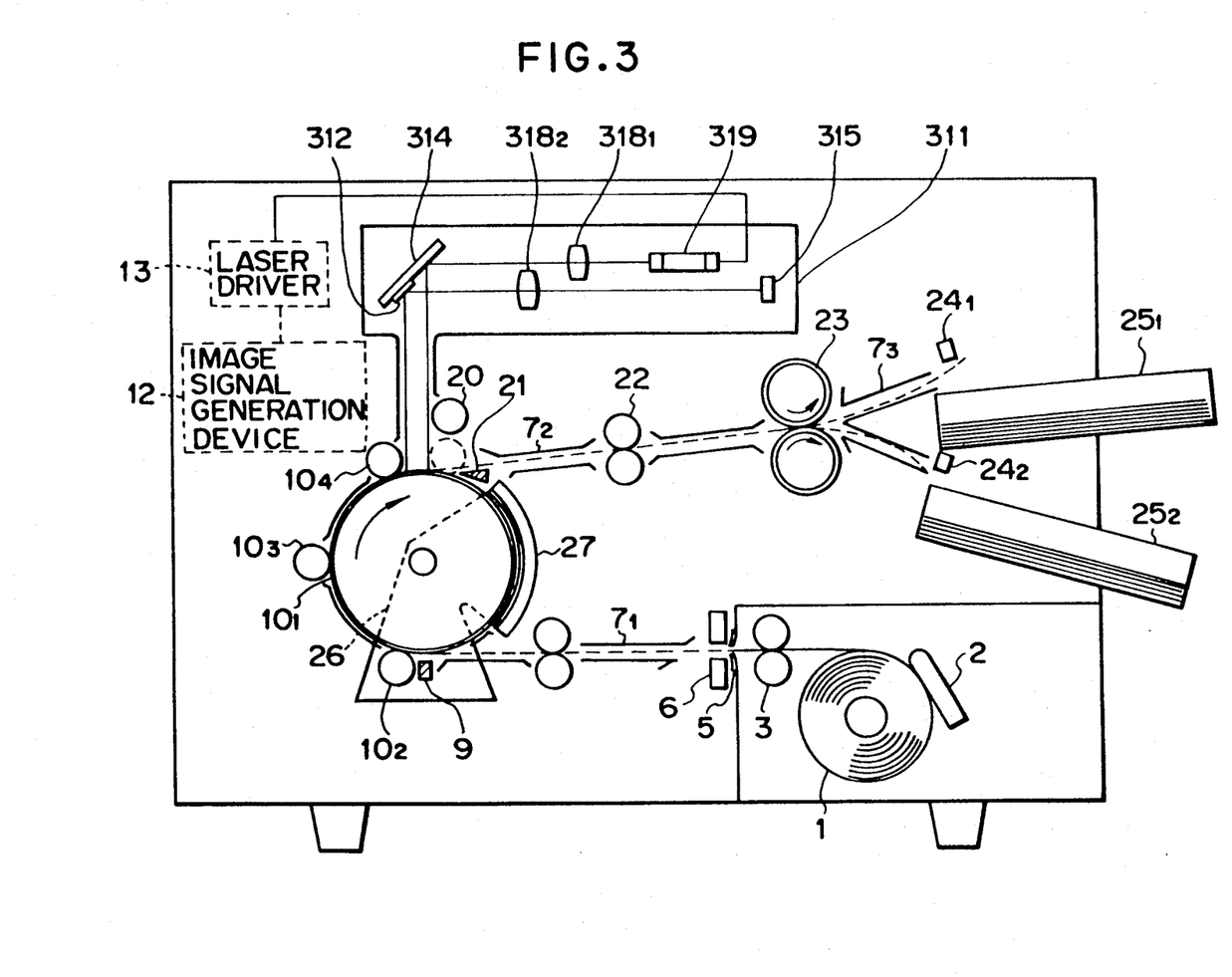
FIG. 3 is a schematic elevational sectional view of an image forming apparatus according to a second embodiment of the present invention.

FIG. 3 is a schematic elevational sectional view of an image forming apparatus according to a second embodiment of the present invention.

In this second embodiment, the image exposure portion and the light source portion installed within the light-shield cover 11 are different from those of the aforementioned first embodiment, and the light-shield cover is changed to a light-shield cover 311 having a dimension suitable to confine the image exposure portion and the light source portion. The other construction is the same as that of the first embodiment, and, therefore, the explanation thereof will be omitted.

In this second embodiment, the light emitted from a semi-conductor laser 319 for effecting the image exposure and the light emitted from a mercury lamp 315 for effecting the whole image exposure are condensed by different lenses $318_1$ and $318_2$, respectively, and are sent to the image forming member 1 via a polygonal mirror 314 and a mirror 312 disposed on the polygonal mirror, respectively.

In FIG. 3, the mercury lamp 315 is disposed below the semi-conductor laser 319 so that the light beams emitted from the mercury lamp 315 and the semiconductor laser 319 are not passed through the same lens. Further, the mirror 312 has a metallic (aluminium) surface having the high reflection ability regarding the ultraviolet ray, thereby permitting the reflection of the laser beam (from the semi-conductor laser) and the light beam (from the mercury lamp) by the single mirror construction.

In this second embodiment, since the laser beam from the semi-conductor laser and the light beam from the mercury lamp are exposed on the image forming member via the different condenser lenses, the image formation can be performed with extremely high accuracy.

Incidentally, the light-shield covers 11, 311 in the illustrated embodiments may comprise overlapped plate members or overlapped clothes, and the material and configuration thereof are not limited to the particular ones so long as it can block the light.

With the arrangement as mentioned above, the present invention provides the following advantages.

Since the whole image exposure portion which must be shielded from the surrounding light is disposed within the same light-shield means as used for the image exposure portion, the installation space for the whole image exposure portion can be eliminated, thus providing the whole image exposure system having the small-sized dimension and the high reliability of the shielding ability.

Further, regarding the light-shield for the whole image exposure portion, since the light-shield means for the image exposure portion is used as it is, an additional light-shield means for the whole image exposure portion is not required, thus providing the image forming apparatus which is inexpensive and is reliable.

Incidentally, in the illustrated embodiments, while an example that the image forming member 1 is formed as the roll which is replaceable was explained, sheet-like image forming members previously cut and stacked in a removable cartridge may be used.

Further, in the illustrated embodiments, while an example that the image exposure by means of the image exposure portion regarding the image forming member 1 is effected only once was explained, the non-polymerized portion of the image forming member 1 may be exposed twice or more. In this case, it is possible to form a plurality of composite images on the same image forming member by means of the same exposure means. Such composite images can be formed by passing the image forming member through the exposure means by rotating the image forming member supporting element (drum roller $10_1$) by several times.

Further, the supporting member $10_2$ may comprise an endless belt.

It should be noted that various alterations and modifications can be adopted without departure from the scope of the present invention.

What is claimed is:

1. An image forming apparatus using photopolymerization reaction, comprising:
   a photosensitive image forming member having a layer of polymer compound and adapted to be used in a sheet-like fashion during the formation of an image;
   an image forming member supporting element for supporting said photosensitive image forming member and adapted to be moved endlessly;
   an image forming member supplying means for supplying said photosensitive image forming member to said supporting element;
   an exposure means disposed in confronting relation to said image forming member supporting element and adapted to effect image exposure on said image forming member;
   a light-shield means for shielding light leaking from said exposure means;
   a heating means disposed in confronting relation to said image forming member supporting element at a downstream side of said exposure means with respect to a rotating direction of said supporting element; and
   a whole image exposure means arranged in said light-shield means.

2. An image forming apparatus using photopolymerization reaction, comprising:
   a photosensitive image forming member having a layer of polymer compound and adapted to be used in a sheet-like fashion during the formation of an image;
   an image forming member supporting element for supporting said photosensitive image forming member and adapted to be moved endlessly;
   an image forming member supplying means for supplying said photosensitive image forming member to said supporting element;
   an exposure means disposed in confronting relation to said image forming member supporting element and adapted to effect image exposure on said image forming member;
   a light-shield means for shielding light leaking from said exposure means;
   a heating means disposed in confronting relation to said image forming member supporting element at a downstream side of said exposure means with respect to a rotating direction of said supporting element; and
   a whole image exposure means arranged in said light-shield means; and wherein
   the image formation on said photosensitive image forming member is effected by shifting said image forming member supporting element endlessly, by passing said image forming member through said exposure means at least twice, by effecting the image exposure by means of said exposure means, by effecting the heating by means of said heating means and by effecting whole image exposure at a position of said exposure means.

3. An image forming apparatus according to claim 2, wherein said image forming member supporting element has a drum shape.

4. An image forming apparatus using photopolymerization reaction, comprising:
- a photosensitive image forming member having a layer of polymer compound and adapted to be used in a sheet-like fashion during the formation of an image;
- an image forming member supporting element for supporting said photosensitive image forming member and adapted to be moved endlessly;
- an image forming member supplying means for supplying said photosensitive image forming member to said supporting element;
- an exposure means disposed in confronting relation to said image forming member supporting element and adapted to effect image exposure on said image forming member;
- a light-shield means for shielding light leaking from said exposure means;
- a heating means disposed in confronting relation to said image forming member supporting element at a downstream side of said exposure means with respect to a rotating direction of said supporting element;
- a whole image exposure means arranged in said light-shield means;
- a separation means for separating said image forming member from said image forming member supporting element; and
- a peeling means disposed at a downstream side of a feeding direction of said image forming member with respect to said separation means; and wherein the image formation on said photosensitive image forming member is effected by shifting said image forming member supporting element endlessly, by passing said image forming member through said exposure means at least twice, by effecting the image exposure by means of said exposure means, by effecting the heating by means of said heating means and by effecting whole image exposure at a position of said exposure means; and a polymerized image portion and a non-polymerized image portion of said image forming member are separated from each other by said peeling means.

5. An image forming apparatus according to claim 4, wherein said photosensitive image forming member comprises a resin base material, a photosensitive layer including heat developing type photosensitive compound, and a polymer layer including photopolymerizable compound.

6. An image forming apparatus according to claim 4, wherein, in forming the image on said photosensitive image forming member, composite images are formed on said image forming member by shifting said image forming member supporting element endlessly, by passing said image forming member through said exposure means at least four times, by repeating the image exposure by means of said exposure means, the heating by means of said heating means and whole image exposure at a position of said exposure means by several times.

7. An image forming apparatus according to claim 4, wherein said exposure means has a semiconductor laser scanning mechanism.

8. An image forming apparatus according to claim 4, wherein said photosensitive image forming member has a roll shape before it is fed to said image forming member supporting element.

* * * * *

UNITED STATES PATENT AND TRADEMARK OFFICE
CERTIFICATE OF CORRECTION

PATENT NO. : 5,113,211

DATED     : May 12, 1992

INVENTOR(S) : KENICHI MATSUMOTO

It is certified that error appears in the above-identified patent and that said Letters Patent is hereby corrected as shown below:

COLUMN 4

Line 54, "b" should read --by--.

COLUMN 6

Line 6, "generation after" should read --generation body 27 is deenergized after--.

COLUMN 8

Line 26, "t" should read --to--.

Signed and Sealed this

Seventeenth Day of August, 1993

*Attest:*

BRUCE LEHMAN

*Attesting Officer*     Commissioner of Patents and Trademarks